United States Patent [19]
Ho et al.

[11] Patent Number: 5,606,564
[45] Date of Patent: Feb. 25, 1997

[54] TEST LOGIC CIRCUIT AND METHOD FOR VERIFYING INTERNAL LOGIC OF AN INTEGRATED CIRCUIT

[75] Inventors: Son H. Ho, Sunnyvale; Hien Nguyen, San Jose, both of Calif.

[73] Assignee: Cirrus Logic Inc., Fremont, Calif.

[21] Appl. No.: 444,589

[22] Filed: May 19, 1995

[51] Int. Cl.$^6$ .................................................. G01R 31/28
[52] U.S. Cl. ...................... 371/22.1; 371/25.1; 371/67.1; 326/16; 327/199
[58] Field of Search .............................. 371/25, 67, 25.1, 371/21.2, 22.3, 22.5, 22.1, 71, 24; 326/93; 307/269; 324/73 R; 364/200

[56] References Cited

U.S. PATENT DOCUMENTS

| | | | |
|---|---|---|---|
| 4,379,327 | 4/1983 | Tietjen | 375/118 |
| 4,556,976 | 12/1985 | Howarth | 371/25.1 |
| 4,622,669 | 11/1986 | Pri-Tal | 371/25.1 |
| 4,942,576 | 7/1990 | Busack | 371/21.2 |
| 5,138,189 | 8/1992 | Leung | 307/272.1 |
| 5,381,418 | 1/1995 | Montoye | 371/21.2 |
| 5,389,838 | 2/1995 | Orengo | 326/93 |
| 5,396,498 | 3/1995 | Lestrat | 371/22.5 |

*Primary Examiner*—Hoa T. Nguyen
*Assistant Examiner*—Nadeem Iqbal
*Attorney, Agent, or Firm*—Lowe, Price, LeBlanc & Becker

[57] ABSTRACT

A test logic circuit for testing the functioning of an integrated circuit containing asynchronous logic and synchronous logic and state machines is provided with a comparison circuit that compares state numbers produced by one of the state machines to a defined target value. The comparison circuit asserts a signal when one of the state numbers is equal to the defined target value. Status latches are coupled to the comparison circuit and latch a status of the asynchronous logic in response to the assertion of the signal by the comparison circuit. The comparing of the state numbers to a defined target value by the comparison circuit in the test logic circuit allows the latching of the status of the asynchronous logic upon the state machine reaching the specified state, and thereby provides the speed necessary to determine the status of the asynchronous logic for a particular state of a state machine in the integrated circuit.

30 Claims, 4 Drawing Sheets

TEST LOGIC CIRCUIT AND METHOD FOR VERIFYING INTERNAL LOGIC OF AN INTEGRATED CIRCUIT

BACKGROUND OF THE INVENTION

1. Technical Field of the Invention

The present invention relates to the field of testing circuitry, and more particularly to testing circuitry for verifying the internal logic of an integrated circuit.

2. Description of Related Art

Prior to the shipping of an integrated circuit, or after the installation of the integrated circuit in a system, it is often desirable to test the internal logic contained in the integrated circuit to verify its proper operation. This is becoming more difficult, however, due to the increasing complexity of the logic in current integrated circuits, and the increased number of functions provided in the integrated circuits.

An additional obstacle to verifying the correct operation of the internal logic of an integrated circuit is the increasing speeds of the integrated circuits. It is normal in test circuitry to "exercise" the integrated circuits off-line to verify or debug the circuit. Off-line exercising involves providing inputs to the internal logic of an integrated circuit and determining how the internal logic reacts to these inputs. The high speeds achieved by current integrated circuits makes this off-line exercising to verify or debug the circuit difficult, if not impossible, to perform. State machines provided in the integrated circuit change state too quickly for a microprocessor coupled to the integrated circuit to be assured of reading a particular state and checking the current status of logic in the integrated circuit when the state machine is in that particular state.

SUMMARY OF THE INVENTION

There is a need for test logic circuitry that will verify the internal logic of an integrated circuit despite the speed of the integrated circuit, and provide an accurate readout of the status of logic when a state machine of the integrated circuit is in any specified state.

This and other needs are met by the present invention which provides a test logic circuit for testing a circuit containing asynchronous logic and synchronous logic and state machines, comprising a comparison circuit that compares state numbers produced by one of the state machines to a defined target value and asserting a signal when one of the state numbers is equal to the defined target value, and status latches, coupled to the comparison circuit, that latch a status of the asynchronous logic in response to the assertion of the signal by the comparison circuit.

The comparing of the state numbers to a defined target value by the comparison circuit in the test logic circuit of the present invention provides the advantage of allowing the latching of the status of the asynchronous logic upon the state machine reaching the specified state. The triggering of the latching based on the simple comparison of the state numbers to a defined value provides the speed necessary to determine the status of the asynchronous logic for a particular state. This avoids attempting a reading of the states of the synchronous logic or the status of the asynchronous logic upon detection of a specific state of the synchronous logic. Such a reading may not be possible in fast integrated circuits.

The earlier stated needs are also met by another aspect of the present invention which provides a system comprising: an integrated circuit having asynchronous logic, synchronous logic and state machines, and a test logic circuit; a microprocessor bus coupled to the integrated circuit; and a microprocessor coupled to the microprocessor bus. The microprocessor controls the test logic to test the integrated circuit by latching status of the asynchronous logic in response to the synchronous logic and state machines entering a defined state.

The present invention also provides a method of verifying an integrated circuit that has asynchronous logic and synchronous logic and state machines. This method comprises selecting a state machine that will generate state numbers indicating a current state of the state machine, comparing the state numbers generated by the selected state machine to a defined target value, and latching status of the asynchronous logic as a function of results of the comparison of the state numbers generated by the selected state machine to the defined target value.

The foregoing and other features, aspects and advantages of the present invention will become more apparent from the following detailed description of the present invention when taken in conjunction with the accompanying drawings.

DETAILED DESCRIPTION OF THE ILLUSTRATIVE EMBODIMENTS

Figure 1:
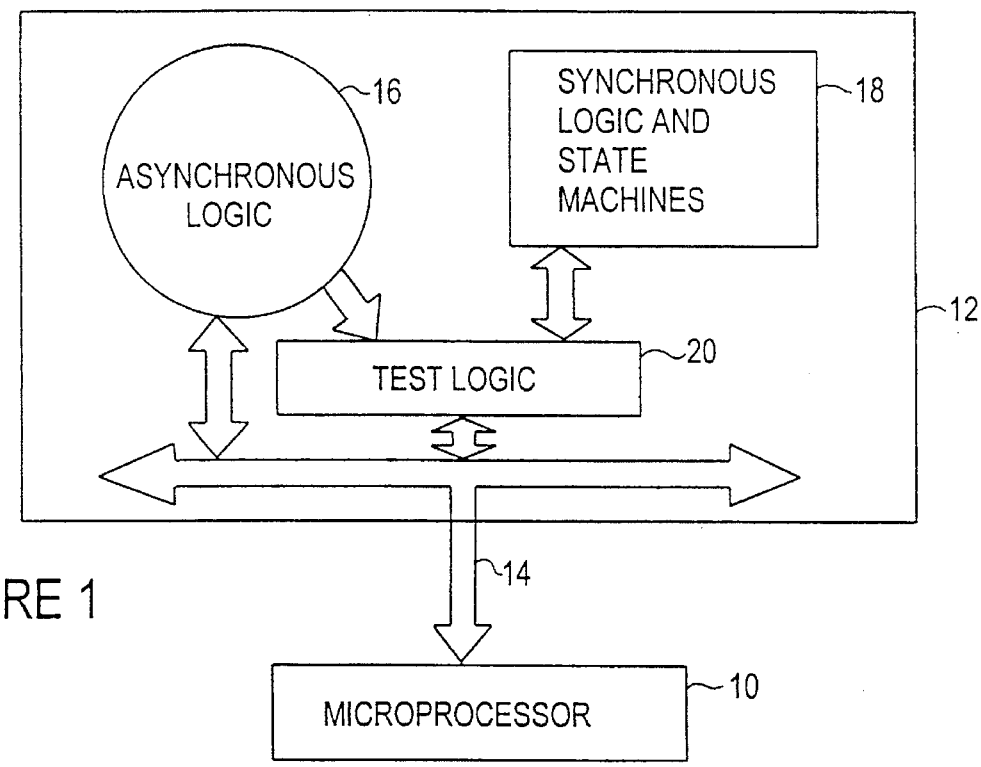
FIG. 1 is a block diagram of an exemplary system employing the test logic of the present invention.

FIG. 1 depicts a portion of an exemplary system that employs the test logic of the present invention. The system includes a microprocessor 10 coupled to a chip 12 by a bus 14. The chip 12 can be any type of chip containing logic circuitry. An example of such a chip 12 is a disk controller that controls a disk drive.

The chip 12 performs its various functions using asynchronous logic 16 and synchronous logic and state machines 18. The asynchronous logic is logic that changes state as its inputs change. By contrast, the synchronous logic and state machines 18 comprises logic that changes state on a clock. A state machine is typically made up of flip-flops for state numbers and combination logic for state transition signals.

In addition to their direct connection to the microprocessor bus 14, the asynchronous logic 16 and the synchronous logic and state machines 18 are coupled to a test logic circuit 20. The test logic circuit 20 is used, for example, after manufacture of the chip 12, to test for correct functioning of the chip 12 prior to shipping of the chip 12 or a system in which the chip 12 is installed. After testing, the test circuit can be disconnected from the internal logic and the microprocessor bus 14 by known techniques. A useful test point is where a group of synchronous logic interacts with a group of asynchronous logic.

Figure 2:
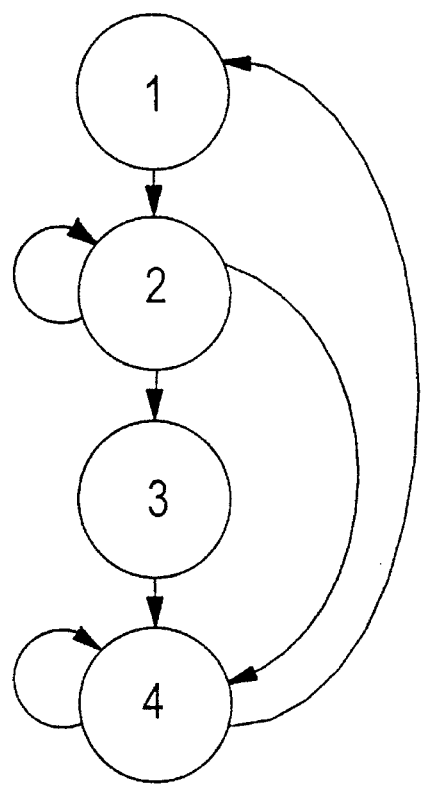
FIG. 2 is an exemplary state diagram of a state machine.

An example of a state diagram for a state machine is provided in FIG. 2 for explanation purposes. For this example, the state machine cycles through four states (1–4). From the first state (1), the state machine enters state 2. The state machine will then, depending on the conditions, either enter state 3, jump directly to state 4, or loop back to state 2 again. The state machine may loop back to state 2 for a defined number of times, for example, before proceeding to either state 3 or state 4. Once the state machine reaches state 4 (either directly from state 2 or through state 3), the state machine can loop and return to state 4 a certain number of times, or return the state machine to state 1.

The switching from state to state occurs very quickly. This makes it extremely difficult in test situations to determine, for example, whether state 3 has ever been entered, or whether the asynchronous logic 16 performs properly when the state machine is in state 3, since state 4 can be entered without the state machine ever entering state 3.

In order to provide the requisite testing, the test logic circuit 20 needs the ability to perform a number of different functions. The test logic circuit 20 must be able to read the state of the synchronous logic 18. It also must be able to set the synchronous logic 18 to a desired specific state. The test logic circuit 20 must also be able to detect that the synchronous logic 18 has arrived at a specific state. Finally, the test logic circuit 20 needs the ability to capture the state of the asynchronous logic 16 upon the related synchronous logic 18 reaching the specific state.

Figure 3:
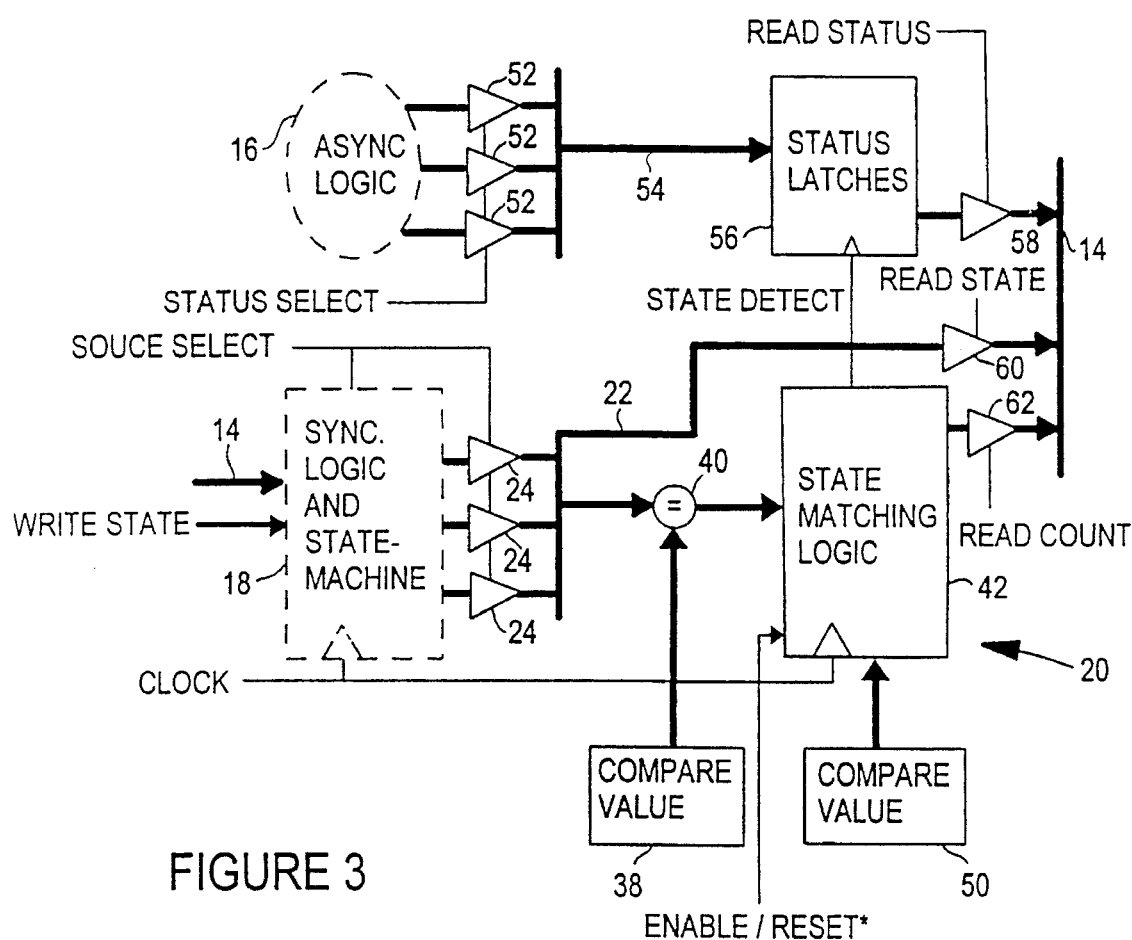
FIG. 3 is a block diagram of the test logic circuit constructed in accordance with an embodiment of the present invention.

An exemplary embodiment of a test logic circuit 20 that is able to perform all of the above functions is depicted in the block diagram of FIG. 3. The test logic circuit 20 has a test bus 22 that is coupled to the synchronous logic and state machines 18 by selectable buffer gates 22. The group of selectable buffer gates 24 form source select multiplexer logic. The test bus 24 carries state numbers of a selected state machine to the microprocessor bus 14.

Figure 4:
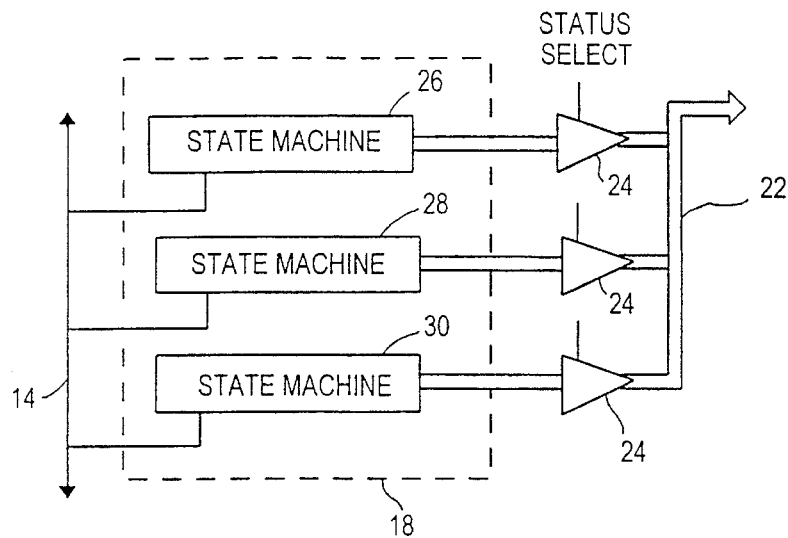
FIG. 4 is a block diagram of synchronous logic and state machines.

Referring for the moment to FIG. 4, the synchronous logic and state machines 18 may include a plurality of state machines 26, 28, and 30. (Although FIG. 4 depicts three state machines, it should be apparent that the synchronous logic and state machines 18 may comprise any number of state machines.) The state machines 26, 28 and 30 perform their usual functions and cycle through their states. Each of the buffers 24 constantly receives the current state number of its associated state machine 26, 28, or 30. When the test logic circuit 20 is enabled to perform testing and it is desired to capture the specific state of a chosen state machine, the buffer 24 that is coupled to this state machine is enabled by a source select signal. When enabled by the source select signal, the specific buffer 24 will provide the current state number of the chosen state machine 26, 28, or 30 to the test bus 22.

Figure 5:
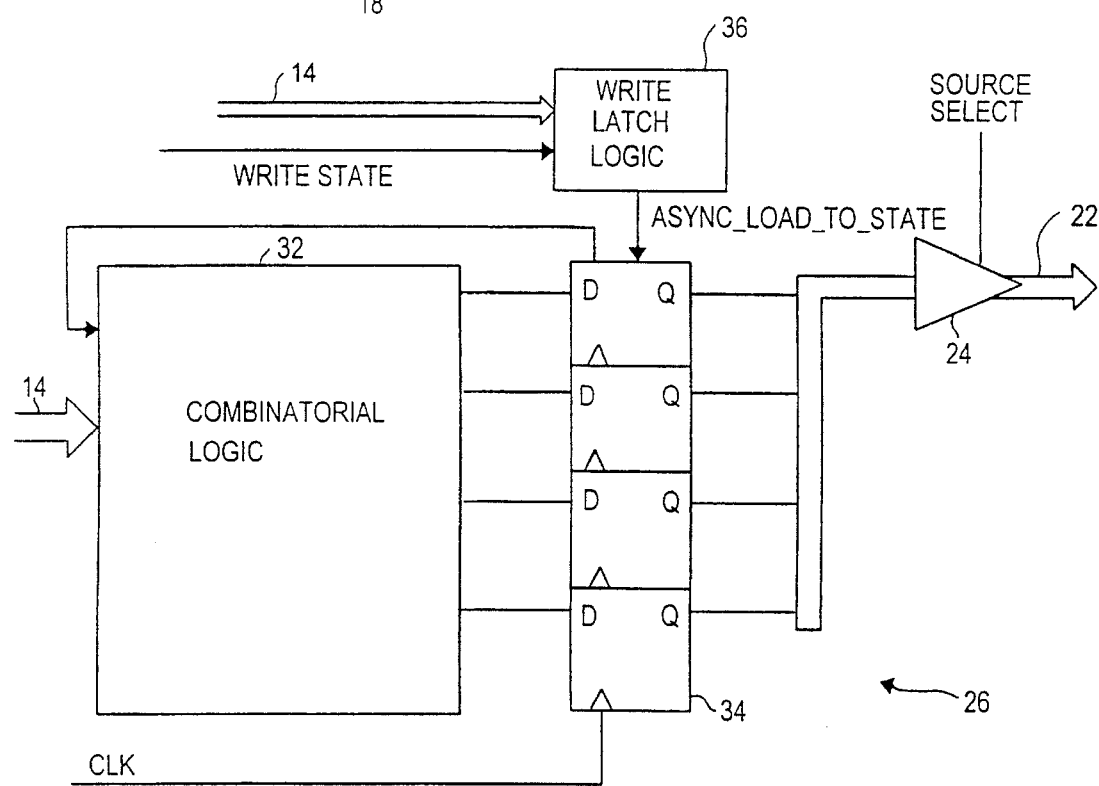
FIG. 5 depicts a single state machine and state number register.

An embodiment of an individual state machine 26, 28, or 30 is depicted in FIG. 5. The state machine, (for example, state machine 26) contains combinatorial logic 32 and a clocked set of registers 34 that receives the state number representing the current state of the state machine 26. The set of registers 34 includes four registers in the illustrated embodiment, providing a four-bit state number, representing up to sixteen states. This is exemplary only, however, as other embodiments of the invention use a set of registers that contain more or less registers.

The set of registers 34 can be forced to a desired state number and the combinatorial logic to a desired state via write logic 36. The desired state is written from the microprocessor bus 14 to the write logic 36 and is loaded into the set of registers 34 in response to a write state signal from the microprocessor 10. The write logic 36 sends an asynchronous load of the state number (ASYNC_LOAD_TO_STATE) that contains the state number to be loaded. The state number is read from the set of registers 34 whenever the buffer 24 for that state machine 26, 28, or 30 is selected by the source select signal from the microprocessor 10. The state number is also fed back to the combinatorial logic 32 to be used to control the proceeding by the state machine to subsequent states.

The state machines 26, 28, and 30 transition between states too fast for the microprocessor 10 to recognize the state and check the status of the asynchronous logic 16 at that time. The test logic circuit 20 therefore "captures" the value of the state number and the status of the asynchronous logic 16 that is present during that state of the state machine.

For this purpose, the test logic circuit 20, as shown in FIG. 3, has a compare value register 38 into which a target state of the synchronous logic and state machines 18 is stored by the microprocessor 10. The value of the state number on the test bus 22 is compared with the target value stored in the compare value register 38 by a comparator 40. When the target value is equal to the value of the state number on the test bus 22, the comparator 40 sends a comparison signal to state matching logic 42.

Figure 6:
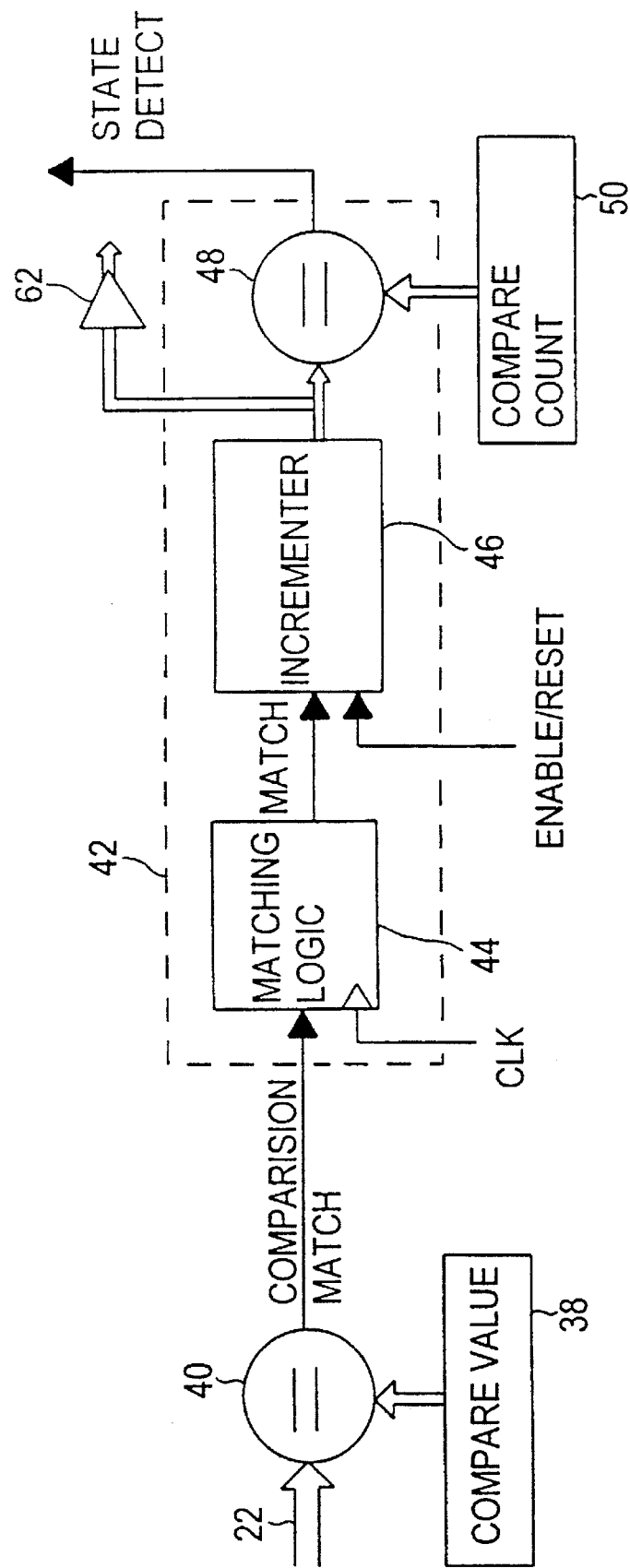
FIG. 6 is a block diagram of an exemplary embodiment of the state matching logic of the test logic circuit of FIG. 3.

It is often desirable to know how many times the synchronous logic and state machines 18 has entered the target state. For example, for testing purposes, it may be necessary for a state machine to enter state 2 ten times before the asynchronous logic 18 achieves a certain status. Therefore the state matching logic 42 maintains a count of how many times a target state was entered. A block diagram of an exemplary embodiment of the state matching logic 42 is provided in FIG. 6.

The comparison signal from the comparator 40, which is a relatively unstable signal, is received by clocked matching logic 44 that stabilizes the signal and asserts a match signal. An incrementer 46 receives the match signal and increments a current count of the matches. The incrementer 46 is enabled and reset by an enable/reset control signal from the microprocessor 10.

The current count of the matches is compared by a comparator 48 with a target count stored by the microprocessor 10 in a compare count register 50. When the current count of the matches is equal to the target count stored in the compare count register 50, this indicates that the synchronous logic and state machines 18 has entered the target state the desired number of times. The state matching logic 42 then asserts a state detect signal.

Referring back to FIG. 3, a plurality of buffers 52 comprise status select multiplexer logic, formed as a distributed multiplexer network. Based upon a status select signal from the microprocessor 10, the buffers 52 select which specific part of the asynchronous logic in the asynchronous logic block 16 is to be captured on a target state of the synchronous logic 18. These buffers 52 provide the status of the selected asynchronous logic over a status bus 54 to status latches 56.

The status latches 56 are controlled by the state detect signal from the state matching logic 42 to latch the status of the asynchronous logic. In other words, the status latches 56 will latch the status of the selected asynchronous logic upon the detection of the target state of the synchronous logic a predetermined number of times.

A buffer 58, controlled by a read status signal from the microprocessor 10, provides the status latched by the status latches 56 to the microprocessor bus 14. Similarly, the state of the synchronous logic and state machines 18 on the test bus 22 is provided to the microprocessor bus 14 via a buffer 60 controlled by a read state signal. The current count of the target state is also provided to the microprocessor bus 10 by a buffer 62 in response to a read count signal asserted by the microprocessor 10.

The operation of the exemplary embodiment of the test logic circuit 20 of FIG. 3 may be summarized as follows with an example. Assume that the microprocessor 10 is to determine the status of a specific asynchronous logic from the asynchronous logic block 16 upon the occurrence of a specific state a predetermined number of times in a specific state machine. The microprocessor 10 loads a target state (i.e., the specific state), such as state 2, into the compare value register 38. It also loads the target count (for example 8) into the compare count register 50. Based upon registers in the microprocessor 10, the source select signal and the status select signal respectively cause the state numbers of the specific state machine (state machine 26, for example) to be provided to the test bus 22, and the status of selected asynchronous logic to be provided to the status bus 54.

The comparator 40 monitors the state numbers on the test bus 22 and compares these state numbers to the target value (2 in this example) stored in the compare value register 38. When they are equal, indicating that the state machine 26 is in state 2, a comparison match signal is provided to the state matching logic 42.

The state matching logic 42 keeps track of the number of times state 2 has been detected and compares this with the value stored in the compare count register 50. When the state machine 26 has entered state 2 a total of 8 times in this example, the state matching logic 42 asserts a state detect signal to the status latches 56.

Upon receiving the state detect signal, the status latches 56 latch the status of the selected asynchronous logic that is currently on the status bus 54. This latched information represents the status of the selected asynchronous logic when the state machine 26 has entered state machine 2 a total of 8 times. The latched status information, as well as the state number and the current count of the number of times state 2 has been entered, may then be read out by the microprocessor 10 over the microprocessor bus 14 in response to the assertion of the read control signals asserted by the microprocessor 10.

The test logic circuit 20 of the present invention provides a means of verifying and debugging the internal logic of very large scale integration (VLSI) chips at a system level of operation, using a minimal amount of test circuitry.

Although the present invention has been described and illustrated in detail, it is clearly understood that the same is by way of illustration and example only and is not to be taken by way of limitation, the spirit and scope of the present being limited only by the terms of the appended claims.

We claim:

1. A test logic circuit for testing a circuit containing asynchronous logic and synchronous logic and state machines, comprising:

a comparison circuit that compares state numbers produced by one of the state machines to a defined target value and asserting a signal when one of the state numbers is equal to the defined target value; and status latches, coupled to the comparison circuit, that latch a status of the asynchronous logic in response to the assertion of the signal by the comparison circuit.

2. The test logic circuit of claim 1, further comprising a buffer coupled to the status latches to read out the status of the asynchronous logic latched by the status latches.

3. The test logic circuit of claim 1, wherein the comparison circuit includes a count circuit that determines a number of times that one of the state numbers is equal to the defined target value and asserts the signal when the number of times is equal to a defined count value.

4. The test logic circuit of claim 3, wherein the comparison circuit includes a compare value register in which the defined target value is stored, a first comparator that receives the state numbers from the state machine and the defined target value from the compare value register and asserts a comparison match signal whenever one of the state numbers received from the state machine is equal to the target value.

5. The test logic circuit of claim 4, wherein the comparison circuit further includes clocked matching logic coupled to the first comparator, the matching logic receiving the comparison match signal and generating a match detect signal in response thereto.

6. The test logic circuit of claim 5, wherein the comparison circuit further includes an incrementer coupled to the matching logic, the incrementer maintaining and generating a current count of a number of times the match detect signal has been generated by the matching logic by incrementing the count whenever the match detect signal is asserted.

7. The test logic circuit of claim 6, wherein the comparison circuit includes a compare count register in which the defined count value is stored, a second comparator coupled to the incrementer and the compare count register and asserting a state detect signal when the current count generated by the incrementer is equal to the defined count value, wherein the state detect signal forms said signal that causes the status latches to latch a status of the asynchronous logic.

8. The test logic circuit of claim 7, further comprising a test bus, coupled between the synchronous logic and state machines and the comparison circuit, carrying the state numbers produced by one of the state machines.

9. The test logic circuit of claim 8, further comprising a status bus, coupled between the asynchronous logic and the status latches, carrying the status of the asynchronous logic.

10. The test logic circuit of claim 9, further comprising source select multiplexer logic, coupled between the synchronous logic and the state machines and the test bus, for selecting which state machine will provide state numbers to the test bus.

11. The test logic circuit of claim 10, further comprising status select multiplexer logic, coupled between the asynchronous logic and the status bus, for selecting particular asynchronous logic to provide status to the test bus.

12. A system comprising:

an integrated circuit having asynchronous logic, synchronous logic and state machines, and a test logic circuit;

a microprocessor bus coupled to the integrated circuit; and a microprocessor coupled to the microprocessor bus, the microprocessor controlling the test logic circuit to test the integrated circuit by latching status of the asynchronous logic in response to the synchronous logic and state machines entering a defined state.

13. The system of claim 12, wherein the test logic circuit comprises:

a comparison circuit that compares state numbers produced by one of the state machines to a defined target value and asserting a signal when one of the state numbers is equal to the defined target value;

status latches, coupled to the comparison circuit, that latch a status of the asynchronous logic in response to the assertion of the signal by the comparison circuit.

14. The system of claim 13 wherein the test logic circuit further comprises a buffer coupled to the status latches to read out the status of the asynchronous logic latched by the status latches.

15. The system of claim 13, wherein the comparison circuit includes a count circuit that determines a number of times that one of the state numbers is equal to the defined target value and asserts the signal when the number of times is equal to a defined count value.

16. The system of claim 15, wherein the comparison circuit includes a compare value register in which the defined target value is stored, a first comparator that receives the state numbers from the state machine and the defined target value from the compare value register and asserts a comparison match signal whenever one of the state numbers received from the state machine is equal to the target value.

17. The system of claim 16, wherein the comparison circuit further includes clocked matching logic coupled to the first comparator, the matching logic receiving the comparison match signal and generating a match detect signal in response thereto.

18. The system of claim 17, wherein the comparison circuit further includes an incrementer coupled to the matching logic, the incrementer maintaining and generating a current count of a number of times the match detect signal has been generated by the matching logic by incrementing the count whenever the match detect signal is asserted.

19. The system of claim 18, wherein the comparison circuit includes a compare count register in which the defined count value is stored, a second comparator coupled to the incrementer and the compare count register and asserting a state detect signal when the current count generated by the incrementer is equal to the defined count value, wherein the state detect signal forms said signal that causes the status latches to latch a status of the asynchronous logic.

20. The system of claim 19, further comprising a test bus, coupled between the synchronous logic and state machines and the comparison circuit, carrying the state numbers produced by one of the state machines.

21. The system of claim 20, wherein the test logic circuit further comprises a status bus, coupled between the asynchronous logic and the status latches, carrying the status of the asynchronous logic.

22. The system of claim 21, wherein the test logic circuit further comprises source select multiplexer logic, coupled between the synchronous logic and the state machines and the test bus, for selecting which state machine will provide state numbers to the test bus.

23. The system of claim 22, wherein the test logic circuit further comprises status select multiplexer logic, coupled between the asynchronous logic and the status bus, for selecting particular asynchronous logic to provide status to the test bus.

24. The system of claim 23, wherein the microprocessor provides the defined target value to the compare value register and the defined count value to the compare count register.

25. The system of claim 24, wherein the microprocessor includes means for reading the status from the microprocessor bus.

26. The system of claim 25, wherein the microprocessor includes means for generating a write state signal that starts a state machine at a defined state.

27. The system of claim 26, wherein the microprocessor includes means for generating a source select signal that selects which state machine will provide state numbers to the test bus.

28. The system of claim 27, wherein the microprocessor includes means for generating a status select signal that selects particular asynchronous logic to provide status to the test bus.

29. A method of verifying an integrated circuit that has asynchronous logic and synchronous logic and state machines, the method comprising:

selecting a state machine that will generate state numbers indicating a current state of the state machine;

comparing the state numbers generated by the selected state machine to a defined target value; and latching status of the asynchronous logic as a function of results of the comparison of the state numbers generated by the selected state machine to the defined target value.

30. The method of claim 29, further comprising maintaining a count of a number of times the state numbers generated by the selected state machine are equal to the defined target value and comparing the number with a defined count value, and generating a signal that causes the status of the asynchronous logic to be latched by status latches when the number is equal to the defined count value.

* * * * *